United States Patent
Gu et al.

(10) Patent No.: US 10,158,030 B2
(45) Date of Patent: Dec. 18, 2018

(54) CMOS AND BIPOLAR DEVICE INTEGRATION INCLUDING A TUNABLE CAPACITOR

(71) Applicant: QUALCOMM Incorporated, San Diego, CA (US)

(72) Inventors: Shiqun Gu, San Diego, CA (US);
Gengming Tao, San Diego, CA (US);
Richard Hammond, San Diego, CA (US); Ranadeep Dutta, Del Mar, CA (US); Matthew Michael Nowak, San Diego, CA (US); Francesco Carobolante, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/431,623

(22) Filed: Feb. 13, 2017

(65) Prior Publication Data

US 2018/0233604 A1   Aug. 16, 2018

(51) Int. Cl.
    *H01L 29/93*   (2006.01)
    *H01L 29/20*   (2006.01)
    (Continued)

(52) U.S. Cl.
    CPC .......... *H01L 29/93* (2013.01); *H01L 21/8221* (2013.01); *H01L 23/66* (2013.01); *H01L 24/13* (2013.01); *H01L 27/0688* (2013.01); *H01L 29/20* (2013.01); *H01L 29/22* (2013.01); *H01L 29/47* (2013.01); *H01L 29/66174* (2013.01); *H01L 29/66242* (2013.01);
    (Continued)

(58) Field of Classification Search
    CPC ........................................................ H01L 29/93
    See application file for complete search history.

(56) References Cited

U.S. PATENT DOCUMENTS 3,094,671 A  *  6/1963  Garrett ................... H01L 29/00
                                                    330/4.9
3,560,886 A  *  2/1971  Cooper et al. .......... H01L 27/00
                                                    257/728

(Continued)

FOREIGN PATENT DOCUMENTS

EP      1633005 A1    3/2006
JP      S5825275 A    2/1983
(Continued)

OTHER PUBLICATIONS

International Search Report and Written Opinion—PCT/US2018/014888—ISA/EPO—dated Jun. 14, 2018.

(Continued)

*Primary Examiner* — Minh-Loan Tran
(74) *Attorney, Agent, or Firm* — Qualcomm Incorporated/Seyfarth Shaw LLP

(57) ABSTRACT

A tunable capacitor may include a first terminal having a first semiconductor component with a first polarity. The tunable capacitor may also include a second terminal having a second semiconductor component with a second polarity. The second component may be adjacent to the first semiconductor component. The tunable capacitor may further include a first conductive material electrically coupled to a first depletion region at a first sidewall of the first semiconductor component.

20 Claims, 15 Drawing Sheets

(51) Int. Cl.
  *H01L 29/22*    (2006.01)
  *H01L 29/47*    (2006.01)
  *H01L 29/737*   (2006.01)
  *H01L 29/66*    (2006.01)
  *H01L 27/06*    (2006.01)
  *H01L 21/822*   (2006.01)
  *H01L 23/00*    (2006.01)
  *H01L 23/66*    (2006.01)
  *H03H 11/34*    (2006.01)
  *H03H 11/04*    (2006.01)

(52) U.S. Cl.
  CPC ......... *H01L 29/7371* (2013.01); *H03H 11/04* (2013.01); *H03H 11/342* (2013.01); *H01L 2224/13025* (2013.01)

(56) References Cited

U.S. PATENT DOCUMENTS

| | | | |
|---|---|---|---|
| 3,962,713 A * | 6/1976 | Kendall | H01L 21/00 257/534 |
| 6,686,640 B2 | 2/2004 | Mheen et al. | |
| 7,323,763 B2 | 1/2008 | Suzuki et al. | |
| 8,803,288 B1 * | 8/2014 | Marino | H01G 7/00 257/602 |
| 2001/0000414 A1 | 4/2001 | Fukayama et al. | |
| 2002/0179957 A1 | 12/2002 | Traylor et al. | |
| 2003/0067026 A1 * | 4/2003 | Bulucea | H01L 27/0808 257/303 |
| 2004/0094792 A1 * | 5/2004 | Akira | H01L 21/84 257/312 |
| 2004/0185632 A1 * | 9/2004 | Berthold | H01L 21/8249 438/326 |
| 2006/0030114 A1 * | 2/2006 | Yeh | H01L 27/0808 438/379 |
| 2008/0157159 A1 * | 7/2008 | Hook | H01L 29/93 257/312 |
| 2008/0237736 A1 * | 10/2008 | Sakurai | H01L 23/66 257/379 |
| 2010/0230753 A1 | 9/2010 | Johnson et al. | |
| 2014/0184346 A1 * | 7/2014 | Li | H03B 5/1243 331/115 |
| 2015/0194538 A1 * | 7/2015 | Marino | H01L 29/94 327/530 |

FOREIGN PATENT DOCUMENTS

| | | |
|---|---|---|
| WO | 9809335 A1 | 3/1998 |
| WO | 2007128075 A2 | 11/2007 |
| WO | 2016048632 A1 | 3/2016 |

OTHER PUBLICATIONS

Partial International Search Report—PCT/US2018/014888—ISA/EPO—dated Apr. 24, 2018.

* cited by examiner

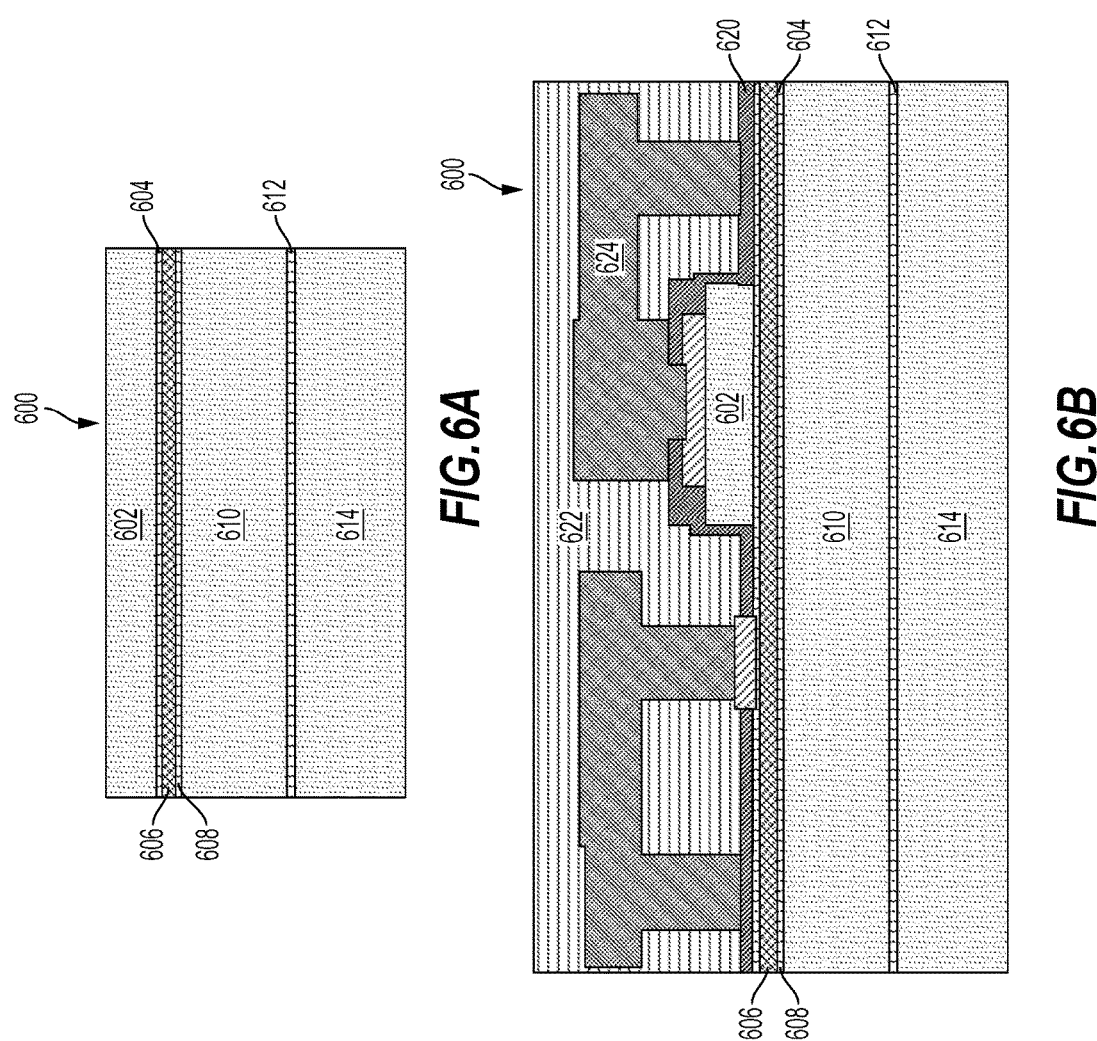

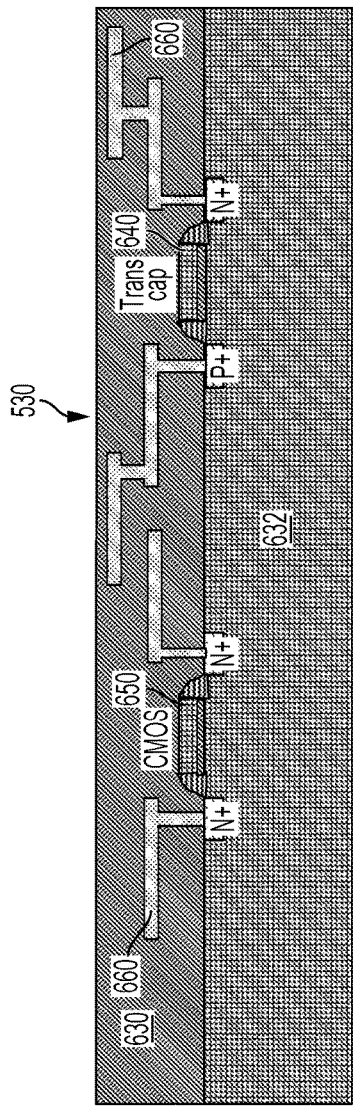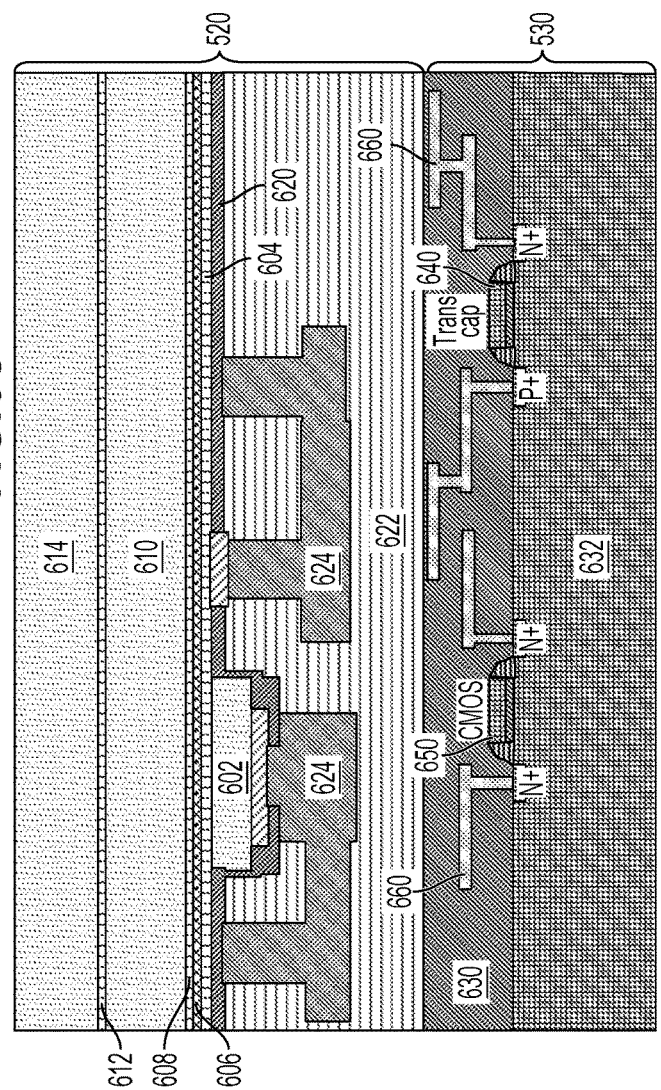

CMOS AND BIPOLAR DEVICE INTEGRATION INCLUDING A TUNABLE CAPACITOR

BACKGROUND

Field

Aspects of the present disclosure relate to semiconductor devices, and more particularly to an integration of complementary metal oxide semiconductor (CMOS) and bipolar device integration including a tunable capacitor.

Background

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include the use of passive devices, which directly affect analog/RF performance considerations, including mismatch, noise, and other performance considerations.

Passive devices may involve high performance inductor and capacitor components. For example, an RF module (e.g., an RF front end (RFFE) module) may include inductors (L) and capacitors (C) arranged to form diplexers, triplexers, multiplexers, low pass filters, balun filters, and/or notch filters to prevent high order harmonics. These passive devices and components may be implemented as passive on glass devices, integrated passive devices, or other like passive devices. Arrangements of these passive devices may be selected to improve device performance, while suppressing unwanted noise (e.g., artificial harmonics) to support advanced RF applications such as carrier aggregation.

The design of mobile RF transceivers may include the use of a voltage-controlled capacitance and/or a tunable capacitor (e.g., a varactor), for example, to provide a voltage-controlled oscillator. Varactors may also be known as variable capacitance diodes. For example, tunable capacitors may provide RF and impedance matching in RF circuits. A CMOS (complementary metal-oxide-semiconductor) tunable capacitor may be tuned by varying a bias across a dielectric in the capacitor, which enables variation of the capacitance. Because column III and column V (III-V) or column II and column IV (II-VI) semiconductor dielectrics are generally unavailable, it is difficult to fabricate capacitors (e.g., a MOS capacitor) in III-V or II-VI semiconductor devices, such as heterojunction bipolar transistor (HBT) devices.

SUMMARY

A tunable capacitor may include a first terminal having a first semiconductor component with a first polarity. The tunable capacitor may also include a second terminal having a second semiconductor component with a second polarity. The second component may be adjacent to the first semiconductor component. The tunable capacitor may further include a first conductive material electrically coupled to a first depletion region at a first sidewall of the first semiconductor component.

A method of integrating a semiconductor device with a complementary metal-oxide-semiconductor (CMOS) structure may include forming a collector layer, a base layer, and an emitter layer on a semiconductor substrate. The method may also include patterning the emitter layer. The method may further include fabricating a metallization layer to access the emitter layer. The method may also include bonding the CMOS structure to the semiconductor substrate. The method may further include patterning the collector layer and the base layer to form the semiconductor device. The method may also include forming vias to access the CMOS structure and electrically coupling the CMOS structure to the semiconductor device.

A radio frequency (RF) front end module may include a filter. The filter may include a die, a substrate supporting the die, a molding compound surrounding the die, and a tunable capacitor. The tunable capacitor may include a first terminal having a first semiconductor component with a first polarity. The tunable capacitor may also include a second terminal having a second semiconductor component with a second polarity. The second semiconductor component may be adjacent to the first semiconductor component. The tunable capacitor may further include a first conductive material electrically coupled to a first depletion region at a first sidewall of the first semiconductor component. The RF front end module may also include a diplexer coupled to the filter, and an antenna coupled to an output of the diplexer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

FIGS. 6A to 6H are cross-sectional views of an integrated circuit (IC) device illustrating a manufacturing process of bonding a semiconductor device to a complementary metal-oxide-semiconductor (CMOS) structure, according to aspects of the present disclosure.

DETAILED DESCRIPTION

Figure 1:
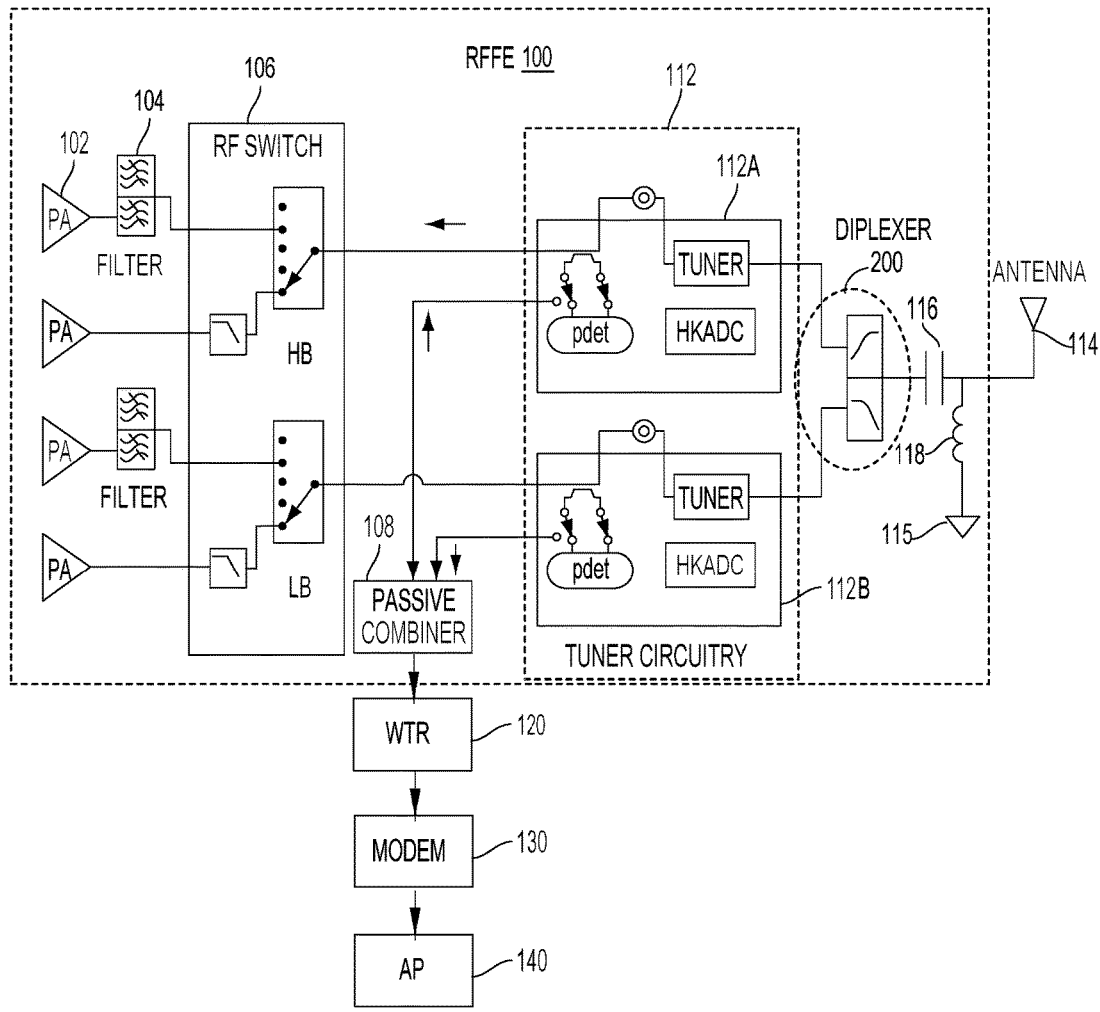
FIG. 1 is a schematic diagram of a radio frequency (RF) front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include the use of passive devices, which directly affect analog/RF performance considerations, including mismatch, noise and other performance considerations.

Passive devices may involve high performance inductor and capacitor components. For example, an RF module (e.g., an RF front end (RFFE) module) may include inductors (L) and capacitors (C) arranged to form diplexers, triplexers, multiplexers, low pass filters, balun filters, and/or notch filters to prevent high order harmonics. These passive devices and components may be implemented as passive on glass devices, integrated passive devices, or other like passive devices. Arrangements of these passive devices may be selected to improve device performance, while suppressing unwanted noise (e.g., artificial harmonics) to support advanced RF applications such as carrier aggregation. The design of these mobile RF transceivers includes the use of additional passive devices, for example, to suppress resonance, and/or to perform filtering, bypassing, and coupling.

Capacitors are passive elements used in integrated circuits for storing an electrical charge. Capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

The design of mobile RF transceivers may include the use of a voltage-controlled capacitance and/or a tunable capacitor (e.g., a varactor), for example, to provide a voltage-controlled oscillator. Varactors may also be known as variable capacitance diodes. For example, tunable capacitors may provide RF and impedance matching in RF circuits. A CMOS (complementary metal-oxide-semiconductor) tunable capacitor may be tuned by varying a bias across a dielectric in the capacitor, which enables variation of the capacitance. Because column III and column V (III-V) semiconductor dielectrics are generally unavailable, it is difficult to fabricate capacitors (e.g., a MOS capacitor) in III-V semiconductor devices, such as heterojunction bipolar transistor (HBT) devices.

Bipolar transistors, which are also referred to as bipolar junction transistors (BJTs), are a type of transistor that uses both hole charge and electron carriers. Bipolar transistors are fabricated in integrated circuits and are also used as individual components. Bipolar transistors are designed to amplify current. This basic function of bipolar transistors makes them a logical choice for implementing amplifiers and switches. As a result, bipolar transistors are widely used in electronic equipment, such as cellular phones, audio amplifiers, and radio transmitters.

A heterojunction bipolar transistor is a type of bipolar transistor that uses different semiconductor materials for emitters and base regions of the device, which creates a heterojunction. A heterojunction bipolar transistor may use a III-V compound semiconductor material, a II-VI compound semiconductor material, or other like compound semiconductor material. III-V (and II-VI) compound semiconductor materials generally exhibit high carrier mobility and direct energy gaps, which makes these compound semiconductor materials useful for optoelectronics. Heterojunction bipolar transistors improve upon bipolar transistors by supporting substantially higher frequencies (e.g., up to several hundred gigahertz (GHz)). Heterojunction bipolar transistors are, therefore, often used in high speed circuits, such as RF chip designs specifying high power efficiency including RF power amplifiers in mobile RF transceivers.

By contrast, a relatively small number of silicon based CMOS transistors are used to manufacture RF power amplifiers because the various analog inductors, capacitors, and resistors that are fundamental to RF applications are generally separate from the RF digital circuits. Highly complex and highly integrated baseband and transceiver RF integrated circuits, however, involve advanced, reduced gate-length CMOS processes for integrating functions in very small die. For example, within an RF front end module, CMOS processes are used to manufacture the switch as well as the digital controls. By contrast, III-V compound semiconductor heterojunction bipolar transistors are used for the power amplifier. The RF front end module also includes filters as well as surface-mount devices (SMD) passives.

The various components of the RF front end module are generally carried by several, separate die. It is, however, desirable to reduce a form factor of the RF front end module because current schemes rely on assembling the various components on a laminate substrate. Unfortunately, this arrangement of the various components on the laminate substrate makes it difficult to reduce the form factor of the RF front end module. One aspect of the present disclosure integrates CMOS based devices and III-V compound semiconductor devices (e.g., heterojunction bipolar transistor devices) in a chip with a reduced module size, while enabling tuning of passive devices for RF matching applications.

According to further aspects of the present disclosure, tunable capacitors also may be used to provide RF and impedance matching in RF circuits. While CMOS tunable capacitors may be tuned by varying a bias across a dielectric in the capacitor, which enables variation of the capacitance, this feature is generally not available in bipolar devices. In particular, because III-V or II-VI compound semiconductor dielectrics are generally unavailable, it is difficult to fabricate capacitors (e.g., a MOS capacitor) in III-V or II-VI semiconductor devices, such as heterojunction bipolar transistor devices.

Aspects of the present disclosure include a tunable capacitor in III-V or II-VI semiconductor devices. A capacitance is tuned by laterally controlling a reverse Schottky bias that varies a depletion width into a doped III-V or II-VI semiconductor region (e.g., an N-type collector or a P-type collector). For example, a reverse bias of a P-N diode is adjusted to control the capacitance.

For wireless communication, passive devices are used to process signals in a carrier aggregation system. In carrier aggregation systems, signals are communicated with both high band and low band frequencies. In a chipset, a passive device (e.g., a diplexer) is usually inserted between an antenna and a tuner (or a radio frequency (RF) switch) to ensure high performance. A diplexer design can also include inductors and capacitors. Diplexers can attain high performance by using inductors and capacitors that have a high quality (Q)-factor.

FIG. 1 is a schematic diagram of a radio frequency (RF) front end (RFFE) module 100 employing a diplexer 200. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 2:
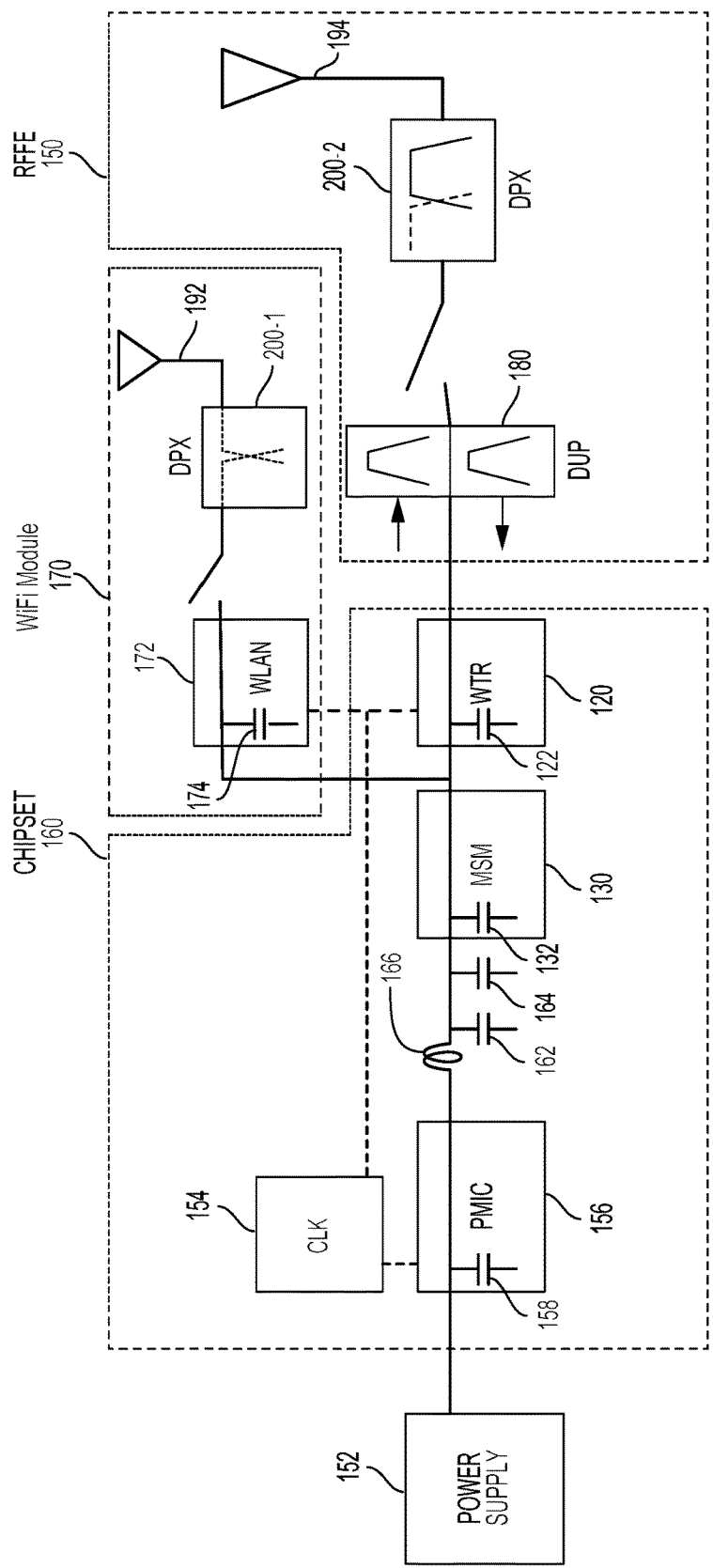
FIG. 2 is a schematic diagram of a radio frequency (RF) front end (RFFE) module employing passive devices for a chipset to provide carrier aggregation.

FIG. 2 is a schematic diagram of a wireless local area network (WLAN) (e.g., WiFi) module 170 including a first diplexer 200-1 and an RF front end (RFFE) module 150 including a second diplexer 200-2 for a chipset 160 to provide carrier aggregation. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 3A:
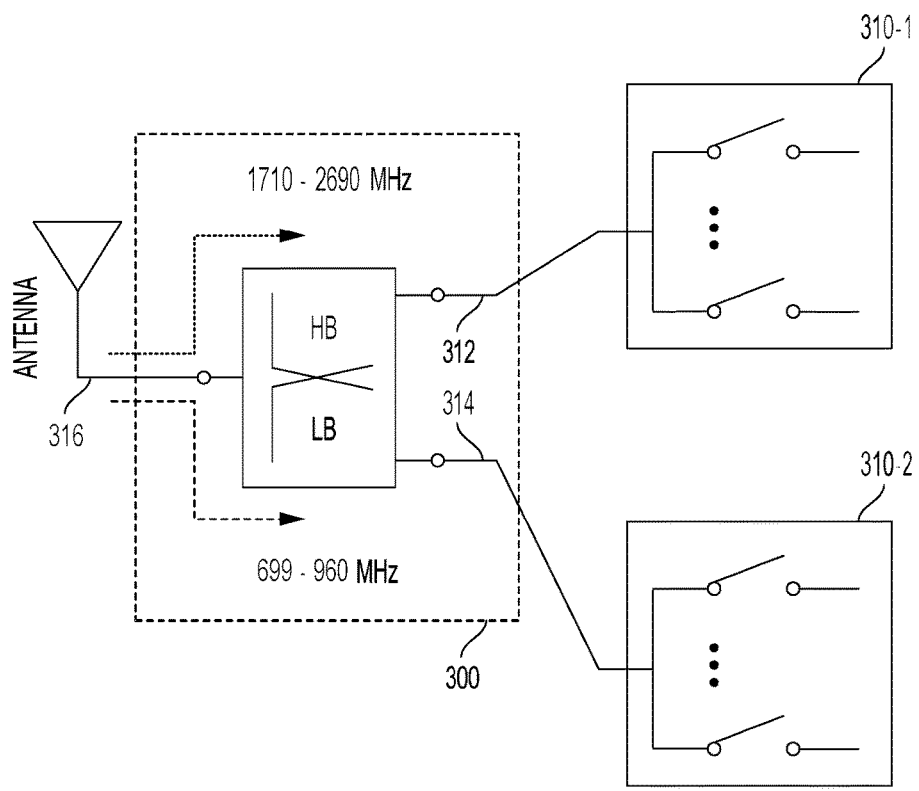
FIG. 3A is a diagram of a diplexer design.

FIG. 3A is a diagram of a diplexer 300. The diplexer 300 includes a high band (HB) input port 312, a low band (LB) input port 314, and an antenna 316. A high band path of the diplexer 200 includes a high band antenna switch 310-1. A low band path of the diplexer 200 includes a low band antenna switch 310-2. A wireless device including an RF front end module may use the antenna switches 310 and the diplexer 300 to enable a wide range band for an RF input and an RF output of the wireless device. In addition, the antenna 216 may be a multiple input, multiple output (MIMO) antenna. Multiple input, multiple output antennas are used for the RF front end of wireless devices to support features such as carrier aggregation.

Figure 3B:
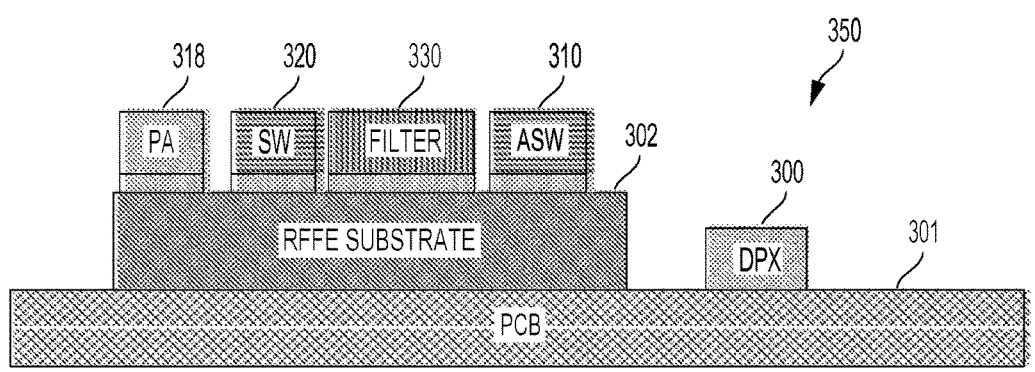
FIG. 3B is a diagram of a radio frequency (RF) front end (RFFE) module.

FIG. 3B is a diagram of an RF front end module 350. The RF front end module 350 includes the antenna switch (ASW) 310 and diplexer 300 (or triplexer) to enable the wide range band noted in FIG. 3A. In addition, the RF front end module 350 includes filters 330, an RF switch 320, and power amplifiers 318 supported by a substrate 302. The filters 330 may include various LC filters, having inductors (L) and capacitors (C) arranged along the substrate 302 for forming a diplexer, a triplexer, low pass filters, balun filters, and/or notch filters to prevent high order harmonics in the RF front end module 350.

In this configuration, the diplexer 300 is implemented as a surface mount device (SMD) on a system board 301 (e.g., printed circuit board (PCB) or package substrate). By contrast, the antenna switch 310 is implemented on the substrate 302 supported by the system board 301 of the RF front end module 350. In addition, the various LC filters of the filters 330 can be implemented as surface mount devices on the substrate 302 of the RF front end module 350. Although shown as filters 330, the LC filters including a low pass filter(s) and/or a notch filter(s) may be arranged throughout the substrate using pick and place technology to prevent high order harmonics in the RF front end module 250.

The RF front end module 350 may include inductors (L) and capacitors (C) arranged to form diplexers, a triplexers, multiplexers, low pass filters, balun filters, and/or notch filters to prevent high order harmonics. These passive devices and components may be implemented as passive on glass devices, integrated passive devices, or other like passive devices. The inductors may be three-dimensional (3D) inductors or two-dimensional (2D) spiral inductors. Arrangement of these passive devices may be performed and selected to improve device performance, while suppressing unwanted noise (e.g., artificial harmonics) to support advanced RF applications such as carrier aggregation.

Figure 4A:
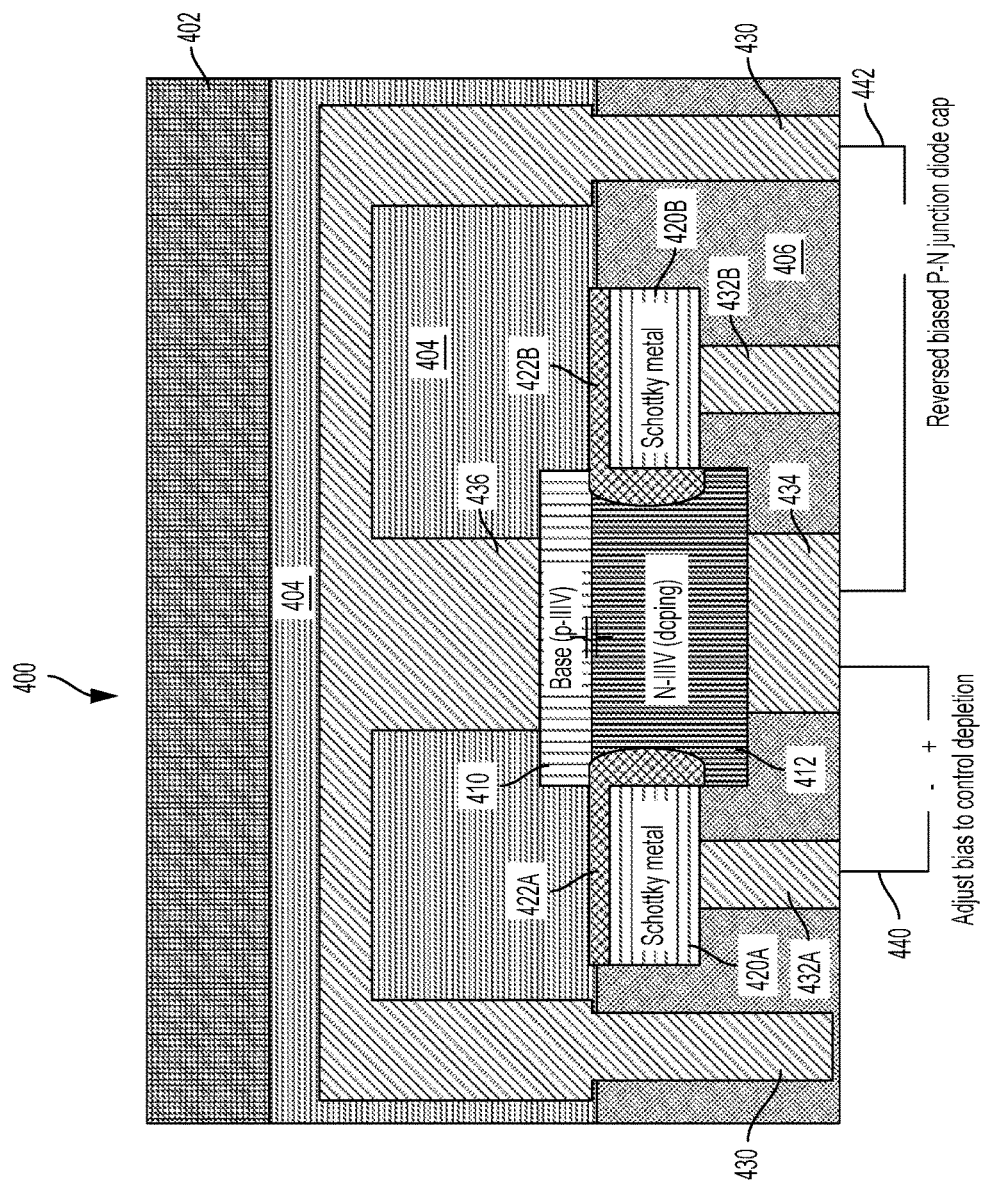
FIG. 4A is a cross-sectional view illustrating a variable capacitance device, according to aspects of the present disclosure.
Figure 4B:
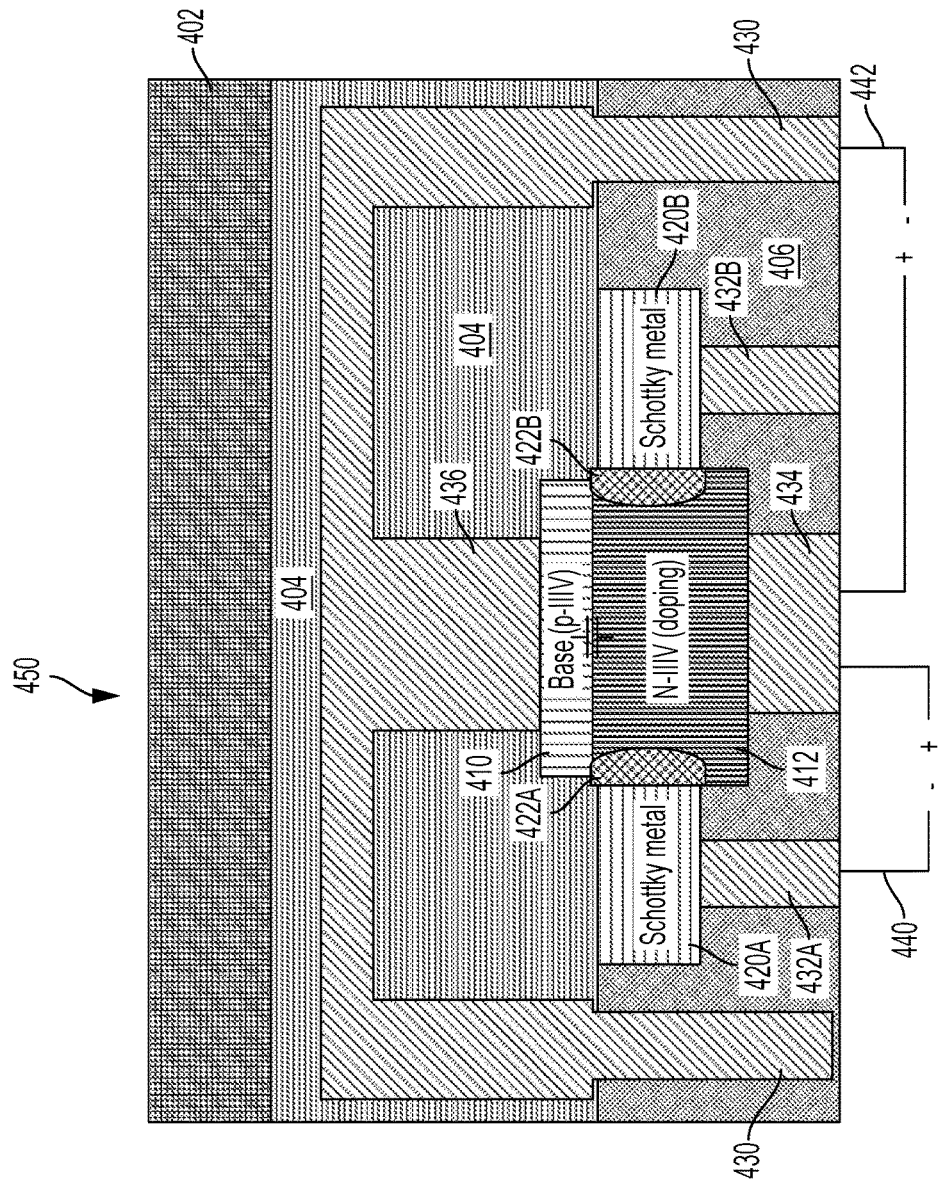
FIG. 4B is a cross-sectional view illustrating a variable capacitance device, according to aspects of the present disclosure.

According to aspects of the present disclosure, an integrated circuit device may include a variable capacitance device, as shown in FIGS. 4A and 4B. The variable capacitance device may be a tunable capacitor (e.g., a varactor). The capacitance of the tunable capacitor may be varied by laterally controlling a reverse Schottky bias that varies a depletion width into a doped III-V or II-VI semiconductor region (e.g., a collector). For example, a reverse bias of a P-N (P-type and N-type) diode is adjusted to control the capacitance.

FIG. 4A is a cross-sectional view illustrating a variable capacitance device 400, according to aspects of the present disclosure. The variable capacitance device 400 may be a tunable capacitor (e.g., a varactor) such as a variable capacitance diode (e.g., a P-N diode). For example, the variable capacitance device 400 may include a first semiconductor component 412 with a first polarity (e.g., a first terminal) supporting a second semiconductor component 410 with a second polarity (e.g., a second terminal). According to an aspect, the first semiconductor component 412 may be a collector and the second semiconductor component 410 may be a base. The second semiconductor component 410 may be a P or N doped III-V compound semiconductor material or II-VI compound semiconductor material, and the first semiconductor component 412 may be an N or P doped III-V compound semiconductor material or II-VI compound semiconductor material. It is understood that these are exemplary only, and other configurations are possible. In accordance with aspects of the present disclosure, the semiconductor materials may be silicon, gallium arsenide (GaAs), indium phosphide, or the like.

A first conductive material 420A (e.g., a metal stack) may be electrically coupled to a first depletion region 422A at a first sidewall of the first semiconductor component 412. A second conductive material 420B (e.g., a metal stack) may be electrically coupled to a second depletion region 422B at a second sidewall of the first semiconductor component 412. The first sidewall and the second sidewall may be opposite each other. The first conductive material 420A and/or the second conductive material 420B may be a Schottky metal. The first depletion region 422A and the second depletion region 422B may extend onto top surfaces (e.g., facing the base) of the first conductive material 420A and the second conductive material 420B, respectively. For example, the first semiconductor component 412 may extend onto a top surface of the first conductive material 420A and the second conductive material 420B, such that the first depletion region 422A and the second depletion region 422B also extend onto the top surface of the first conductive material 420A and the second conductive material 420B, respectively.

Metallization 436 and 430 may couple the second semiconductor component 410 to an electrode of a reverse biased electrode 442. Metallization 434 may be formed underneath the first semiconductor component 412 to couple the first semiconductor component 412 to another electrode of the reverse biased electrode 442. Metallization 434 may also couple the first semiconductor component 412 to a forward biased electrode 440. Metallization 432A may couple the first conductive material 420A to the forward biased electrode 440. Metallization 432B may also be used for coupling the second conductive material 420B. Direct current (DC) across metallization 432A and 432B may control the variable capacitance. The tuning control terminals provided by metallization 432A and 432B are independent from the capacitor terminals, the base, and the collector metals provided by metallization 430 and 434. The metallization described herein may be gold, copper, or platinum. Of course, these are exemplary only, and other materials may be used.

According to an aspect of the present disclosure, a capacitance of the variable capacitance device 400 may be tuned by laterally controlling a reverse Schottky bias that varies a depletion width across the first semiconductor component 412. For example, the reverse biased electrode 442 is adjusted to control the capacitance. As the first depletion region 422A and the second depletion region 422B are controlled to expand towards the center of the first semiconductor component 412, the capacitance decreases. Conversely, when the first depletion region 422A and the second depletion region 422B are controlled to retract away from the center of the first semiconductor component 412, the capacitance increases.

The variable capacitance device 400 may be formed on an integrated circuit device (e.g., a radio frequency (RF) module), and may include a first layer 406 (e.g., a passivation layer), a second layer 404 (e.g., a dielectric layer) and a third layer 402 (e.g., a Si or Cu support layer). The first layer 406 may support the first semiconductor component 412, the first conductive material 420A, and the second conductive material 420B of the variable capacitance device 400.

FIG. 4B shows an alternative version of a variable capacitance device 450. According to this version, the first depletion region 422A and the second depletion region 422B remain within the first semiconductor component 412. For example, the first conductive material 420A and the second conductive material 420B may contact the second layer 404. Otherwise, the variable capacitance device 450 is substantially identical to the above description for FIG. 4A.

For example, similar to the above for FIG. 4A, a capacitance of the variable capacitance device 450 may be tuned by laterally controlling a reverse Schottky bias. The capacitance decreases as the first depletion region 422A and the second depletion region 422B are controlled to expand towards the center of the first semiconductor component 412. Conversely, the capacitance increases when the first depletion region 422A and the second depletion region 422B are controlled to retract away from the center of the first semiconductor component 412.

As illustrated in FIG. 3B, the various components of the RF front end module are generally carried by several, separate die. It is, however, desirable to reduce a form factor of the RF front end module because current schemes rely on assembling the various components on a laminate substrate. Unfortunately, this arrangement of the various components on the laminate substrate makes it difficult to reduce the form factor of the RF front end module. One aspect of the present disclosure integrates CMOS based devices and III-V or II-VI compound semiconductor devices (e.g., heterojunction bipolar transistor devices) in a chip with a reduced module size, while enabling tuning of passive devices for RF matching applications, for example, as shown in FIG. 5.

Figure 5:
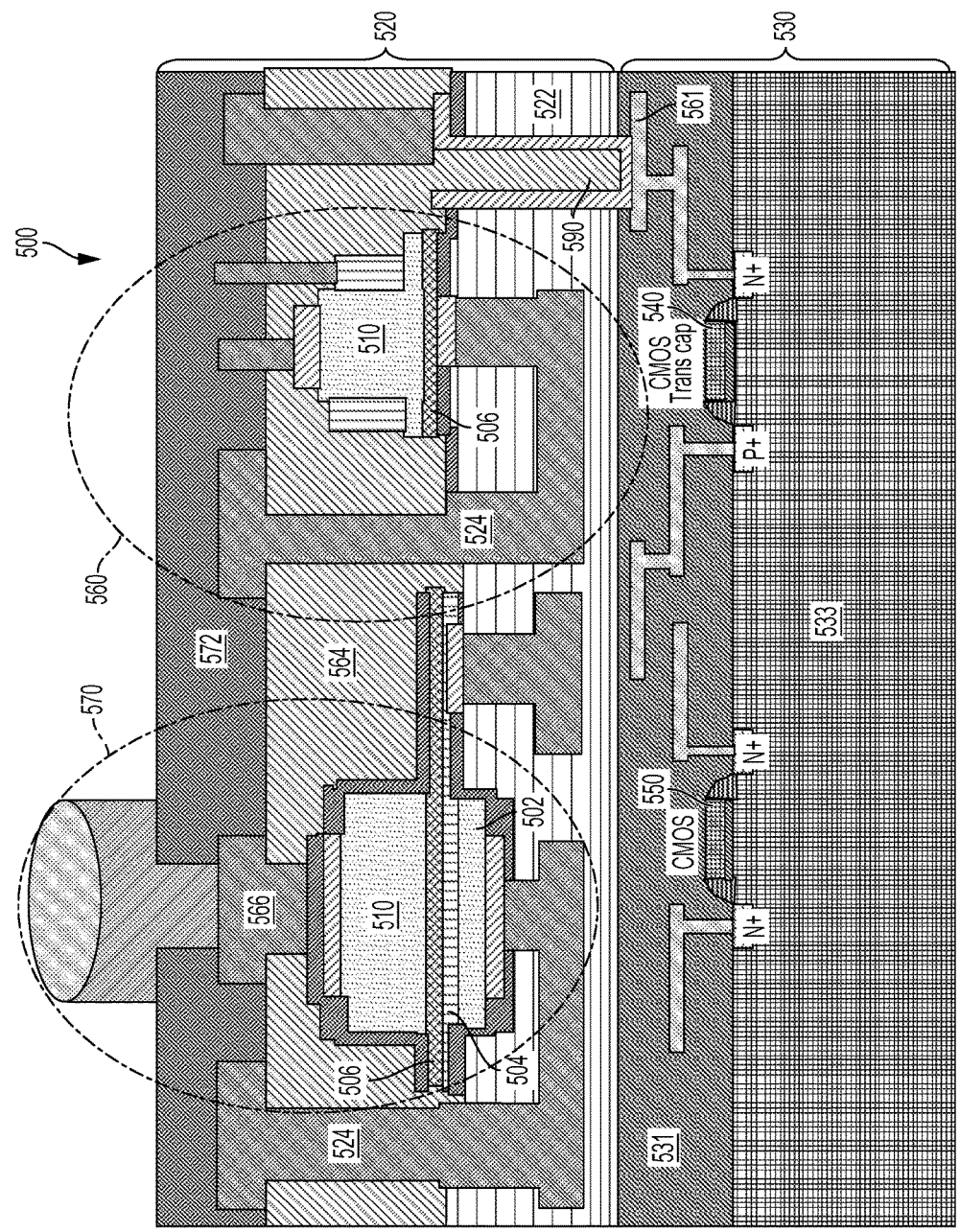
FIG. 5 is a cross-sectional view of an integrated circuit (IC) device including a compound semiconductor device bonded to a complementary metal-oxide-semiconductor (CMOS) structure, according to aspects of the present disclosure.

FIG. 5 is a cross-sectional view of an integrated circuit (IC) device 500 having a compound semiconductor device 520 bonded to a complementary metal-oxide-semiconductor (CMOS) structure 530. The compound semiconductor device 520 may include a bipolar transistor 570 and a variable capacitance device 560, according to aspects of the present disclosure.

The bipolar transistor 570 may be a heterojunction bipolar transistor (HBT) that includes an emitter cap layer 502, an emitter layer 504, a base layer 506, and a collector layer 510. The variable capacitance device 560 may be a tunable capacitor (e.g., a varactor) that includes a base layer 506 and a collector layer 510. The emitter cap layer 502, the emitter layer 504, and the collector layer 510 may be N or P doped. The base layer 506 may be P or N doped (e.g., a P-type doped base, or an N-type doped base). According to an aspect of the present disclosure, the base layer 506 and the collector layer 510 may be GaAs, or other similar material. The bipolar transistor 570 and variable capacitance device 560 may further include metallization 524 and 566 for coupling portions of the bipolar transistor 570 and variable capacitance device 560 to other devices, respectively.

The bipolar transistor 570 and the variable capacitance device 560 may be supported by a first dielectric layer 522. A second dielectric layer 564 may be supported by the first dielectric layer 522. A capping layer 572 may be supported by the second dielectric layer 564.

The CMOS structure 530 may include a CMOS device 550 and a trans cap device 540. The CMOS device 550 may include N doped wells, while the trans cap device 540 may include P and N doped wells. Alternatively, the CMOS device 550 may include P doped wells. The CMOS device 550 and the trans cap device 540 may be supported by a substrate 533. A dielectric layer 531 may be supported by the substrate 533.

According to an aspect of the present disclosure, the CMOS structure 530 is bonded at the dielectric layer 531 to the first dielectric layer 522 of the compound semiconductor device 520. Metallization 561 may couple active and passive devices of the CMOS structure 530 to active and passive devices of the compound semiconductor device 520 through a via 590.

FIGS. 6A-6H are cross-sectional views of an integrated circuit (IC) device 500 illustrating a manufacturing process of bonding a compound semiconductor device 520 to a CMOS structure 530, according to aspects of the present disclosure.

FIG. 6A shows a cross-section of an epitaxial wafer 600 having an emitter cap layer 602, an emitter layer 604, a base layer 606, a first etch stop layer 608, a collector layer 610, a second etch stop layer 612, and a substrate layer 614. These layers may be formed epitaxially. The emitter cap layer 602, the emitter layer 604, and the collector layer 610 may be N-type or P-type doped. The base layer 606 may be P or N doped and may be GaAs, or other similar material. The first etch stop layer 608 and the second etch stop layer 612 may be GaP, or other similar material. The collector layer 610 and the substrate layer 614 may be GaAs, or other similar material.

FIG. 6B shows a cross-section of the epitaxial wafer 600 with the emitter cap layer 602 patterned to expose portions of the emitter layer 604. According to an aspect of the present disclosure, a passivation layer 620 may be deposited over the emitter cap layer 602 (after patterning) and an exposed portion of the emitter layer 604. The passivation layer 620 provides electrical isolation, and may be silicon dioxide (SiO2), silicon nitride (SiN), polyamide, etc. The passivation layer 620 can also passivate the surface(s) to which it is applied. For example, SiN may be applied to passivate defects from the manufacturing process. Metallization 624 and a dielectric layer 622 may also be deposited.

FIG. 6C shows a cross-section of the CMOS structure 530 after fabrication. The CMOS structure 530 may include a CMOS device 650 with N doped wells, and a trans cap device 640 with P and N doped wells. The CMOS device 650 may also have P doped wells. The CMOS device 650 and the trans cap device 640 may be supported by a substrate 632. A dielectric layer 630 and metallization 660 may be deposited over the CMOS device 650 and the trans cap device 640.

FIG. 6D shows the compound semiconductor device 520 bonded to the CMOS structure 530. According to an aspect, the compound semiconductor device 520 may be flip mounted to the CMOS structure 530. The compound semiconductor device 520 and the CMOS structure 530 may be bonded at the dielectric layer 622 and the dielectric layer 630, respectively.

Figure 6E:
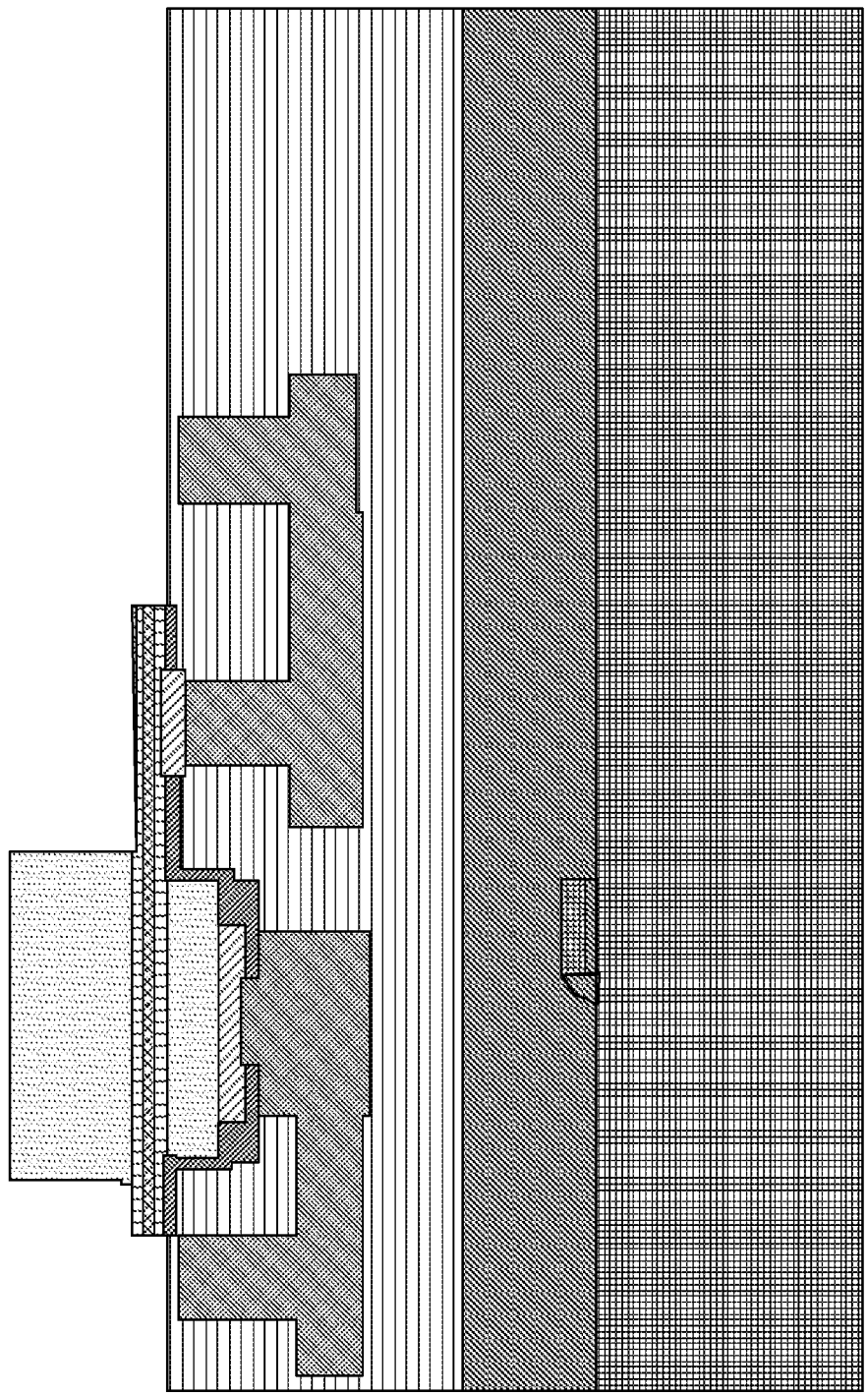

FIG. 6E shows the removal of the substrate layer 614 and patterning of the collector layer 610 and the base layer 606. For example, the collector may be formed by patterning the collector layer 610 to the second etch stop layer 612. A passivation layer 620 may be deposited over the collector layer 610, after patterning. The base may be formed by patterning the base layer 606 up to the dielectric layer 622.

Figure 6F:
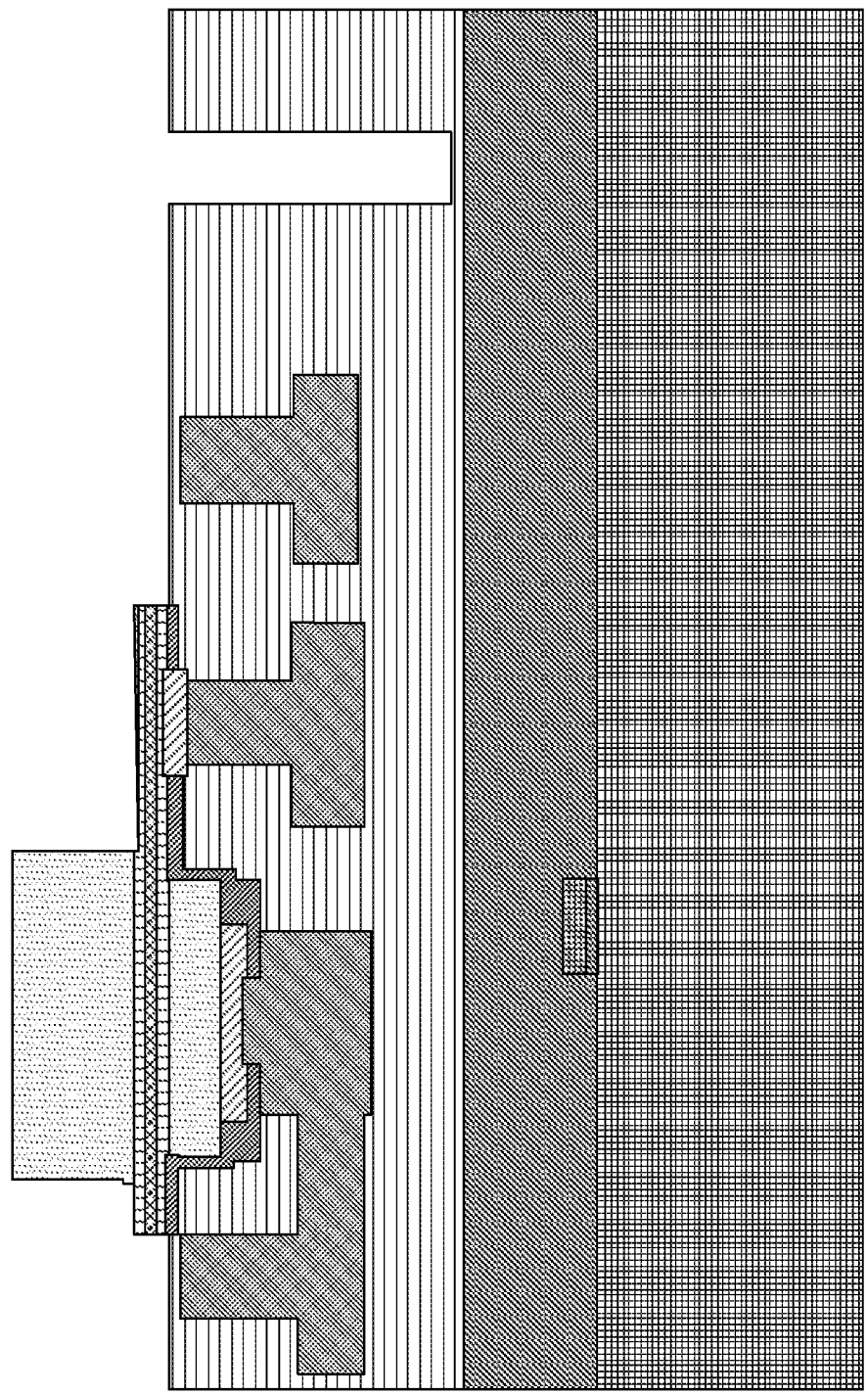
Figure 6G:
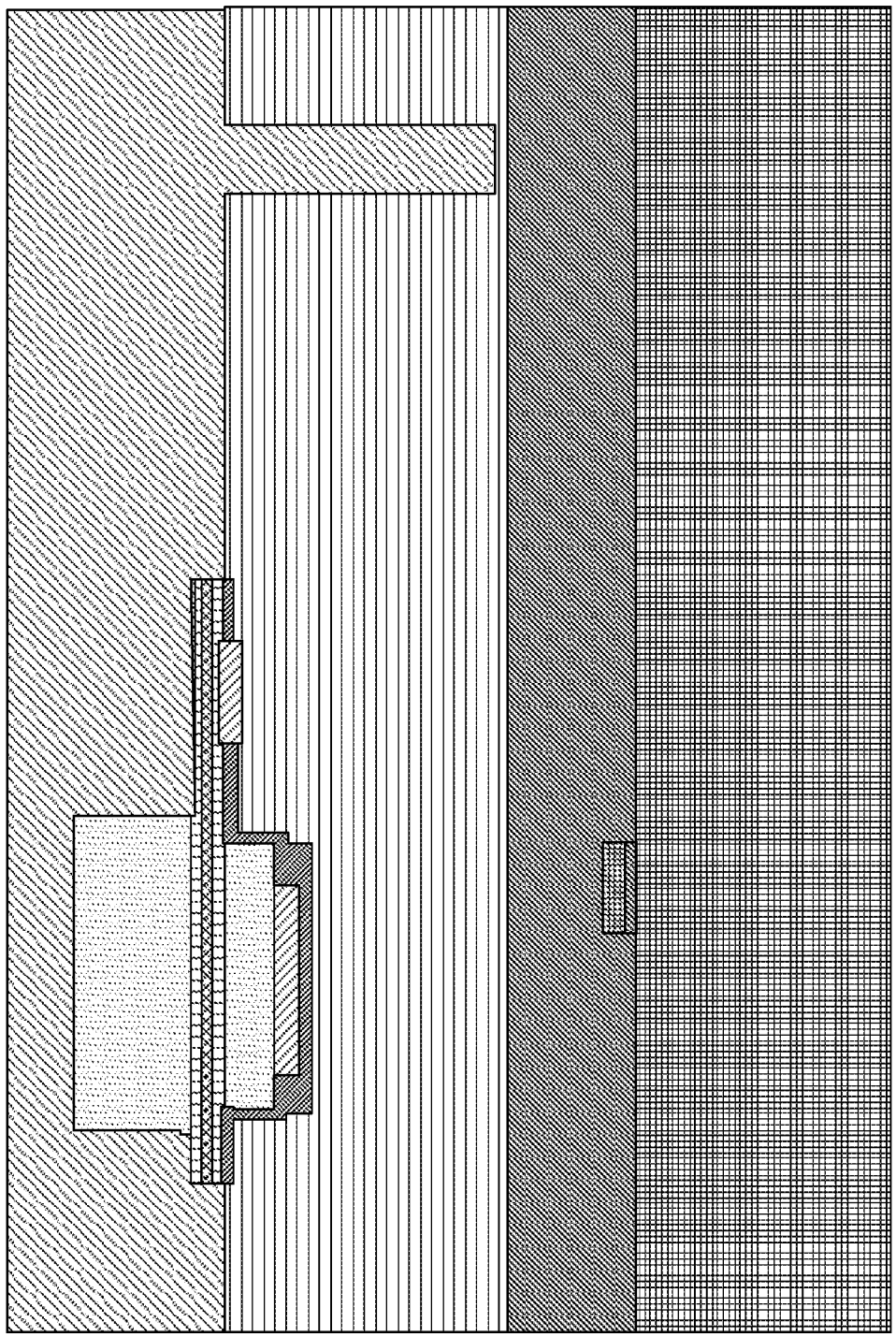
Figure 6H:
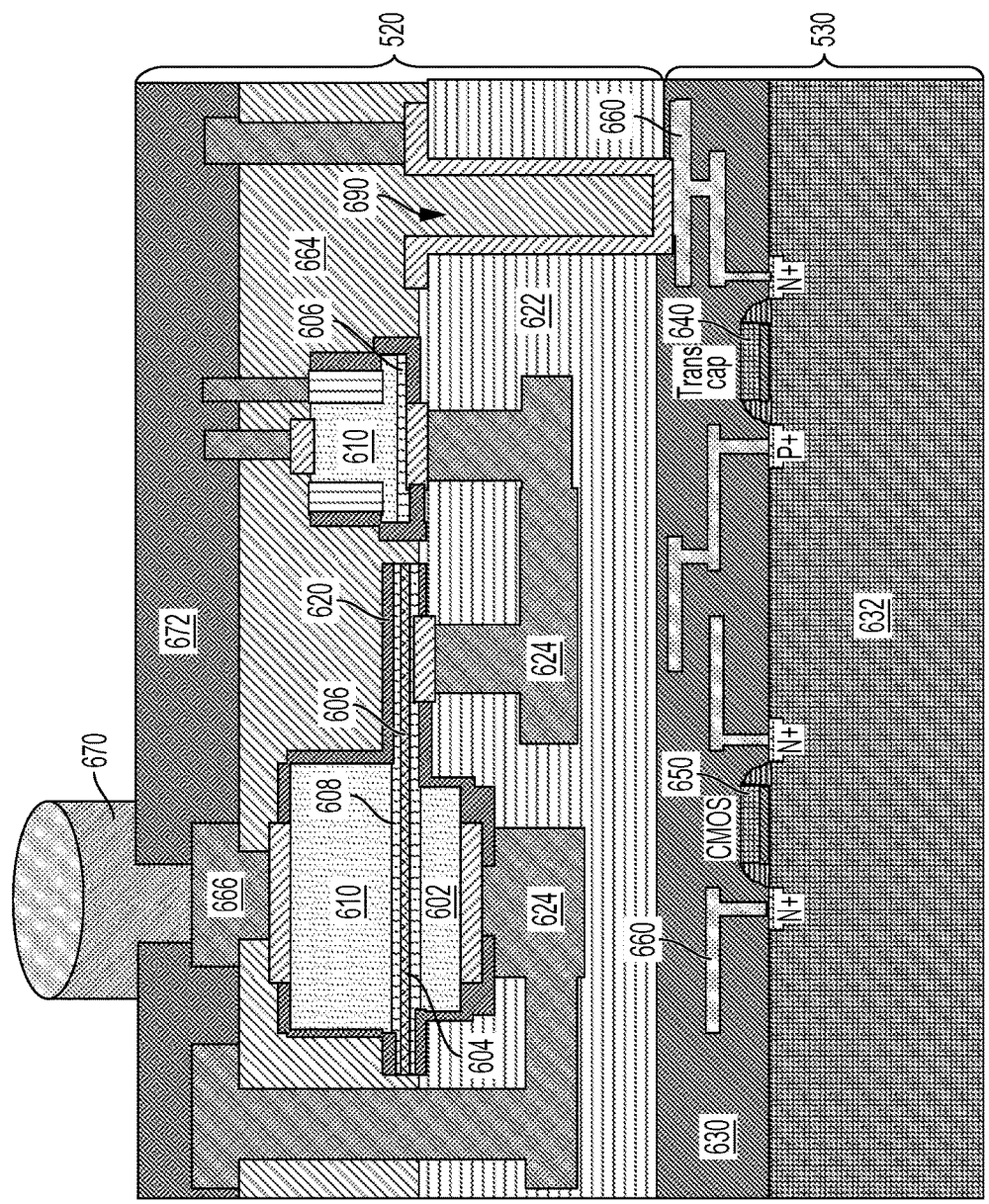

FIG. 6F shows etching of a deep via 690 to connect the compound semiconductor device 520 to the CMOS structure 530. FIG. 6G shows metallization 666 and a dielectric layer 664 deposited over the base layer 606 and collector layer 610, after patterning. FIG. 6H shows a capping layer 672 (e.g., a molding compound) and a conductive bump 670 (e.g., solder balls, metal bonding, etc.) formed over the dielectric layer 664. The conductive bump 670 may be used for coupling to a die. In accordance with aspects of the present disclosure, the metallization may be gold, copper, or platinum. Of course, these are exemplary only, and other materials may be used.

Figure 7:
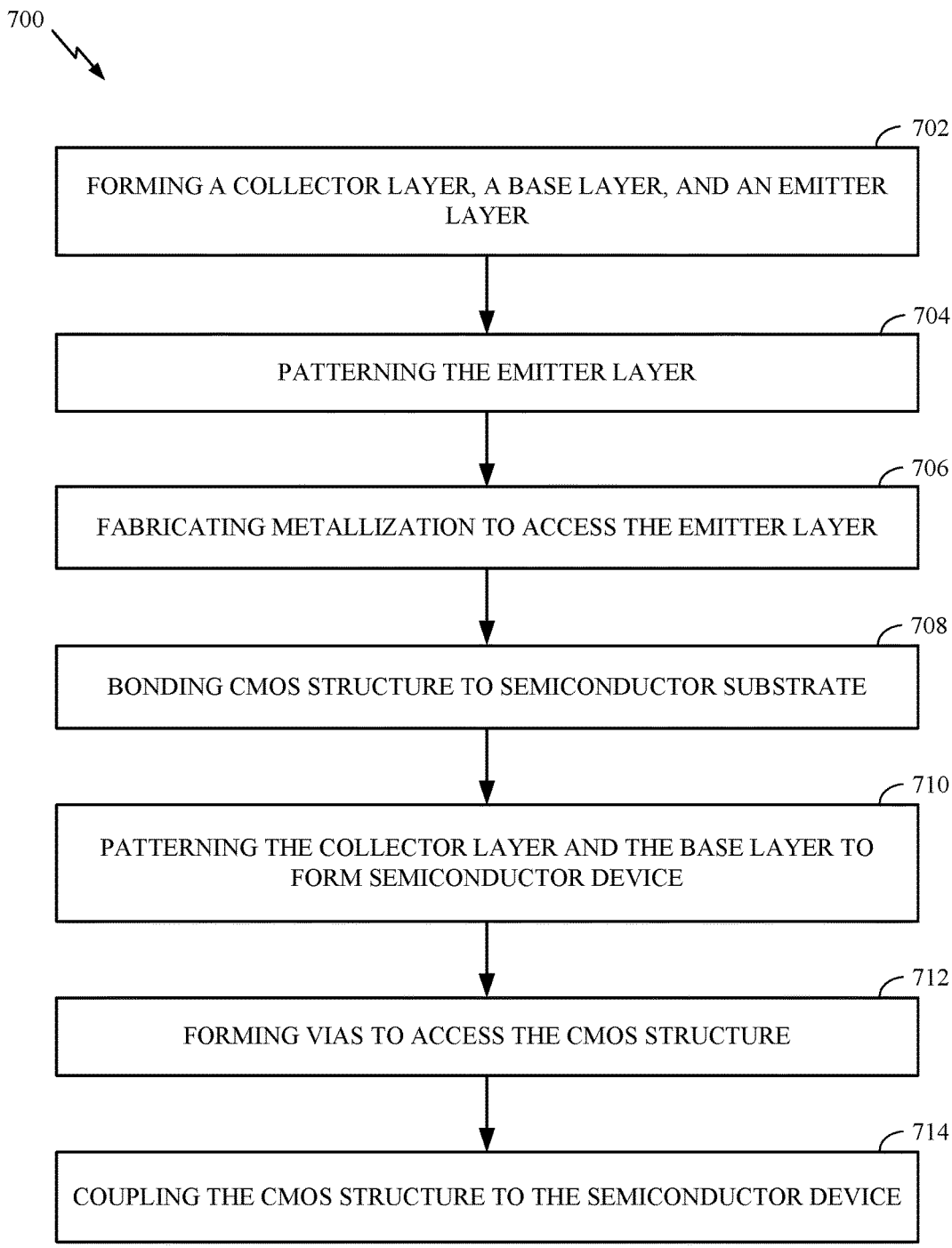
FIG. 7 illustrates a method of fabricating an integrated circuit (IC) device including a semiconductor device bonded to a complementary metal-oxide-semiconductor (CMOS) structure, according to aspects of the present disclosure.

FIG. 7 illustrates a method 700 of integrating a semiconductor device with a CMOS structure, according to aspects of the present disclosure. In block 702, a collector layer, a base layer, and an emitter layer are formed on a semiconductor substrate. As shown in FIG. 6A, an epitaxial wafer 600 may include epitaxially formed layers, such as an emitter cap layer 602, an emitter layer 604, a base layer 606, a first etch stop layer 608, a collector layer 610, a second etch stop layer 612, and a substrate layer 614. The emitter cap layer 602, the emitter layer 604, and the collector layer 610 may be N or P doped, and the base layer 606 may be P or N doped.

In block 704, the emitter layer is patterned. As shown in FIG. 6B, the emitter cap layer 602 is patterned to expose portions of the emitter layer 604. A passivation layer 620 may be deposited over the emitter cap layer 602 and the exposed portion of the emitter layer 604. According to an aspect of the present disclosure, the base layer 606 may also be patterned.

In block 706, metallization is fabricated (e.g., fabricating metallization) to access the emitter layer. As shown in FIG. 6B, metallization 624 and a dielectric layer 622 are deposited. According to an aspect, the base layer 606 may also be accessed by the metallization.

In block 708, the CMOS structure is bonded to the semiconductor substrate. As shown in FIG. 6D, the compound semiconductor device 520 may be flip mounted to the CMOS structure 530. The compound semiconductor device 520 and the CMOS structure 530 may be bonded at the dielectric layer 622 and the dielectric layer 630, respectively. In accordance with an aspect, the CMOS structure may comprise at least one CMOS device. Additionally, the semiconductor substrate may be silicon, gallium arsenide (GaAs), indium phosphide, or the like.

In block 710, the collector layer and the base layer are patterned to form the semiconductor device. As shown in FIG. 6E, the collector may be formed by patterning the collector layer 610 to the second etch stop layer 612. Additionally, the passivation layer 620 may be deposited over the collector layer 610, after patterning. The base may then be formed by patterning the base layer 606 to the dielectric layer 622. Alternatively, the base layer 606 could also be patterned with the emitter layer 604, as described above.

In block 712, vias are formed (e.g., forming vias) to access the CMOS structure, as shown in FIG. 6F. The process may also include fabricating at least one conductive bump (e.g., the conductive bump 670) for coupling to a die. In block 714, the CMOS structure is coupled to the semiconductor device. As shown in FIG. 6G, the CMOS structure 530 may be electrically coupled to the compound semiconductor device 520 through the via 690.

In accordance with an aspect, the CMOS structure comprises a CMOS capacitor and the semiconductor device comprises a heterojunction bipolar transistor (HBT) and/or a tunable capacitor. Furthermore, the semiconductor device may comprise a III-V or II-VI compound semiconductor material (e.g., a compound).

According to the present disclosure, an integrated circuit device includes means for adjusting capacitance. For example, the means for adjusting capacitance may be either the first conductive material 420A or the second conductive material 420B, as shown in FIGS. 4A and 4B. In another aspect, the aforementioned means may be any module or any apparatus configured to perform the functions recited by the aforementioned means.

Aspects of the present disclosure include a tunable capacitor in III-V or II-VI semiconductor devices. A capacitance is tuned by laterally controlling a reverse Schottky bias that varies a depletion width into a doped III-V or II-VI semiconductor region (e.g., a collector). For example, a reverse bias of a P-N diode is adjusted to control the capacitance. Additional aspects of the present disclosure are directed to bonding a semiconductor device to a CMOS structure.

Figure 8:
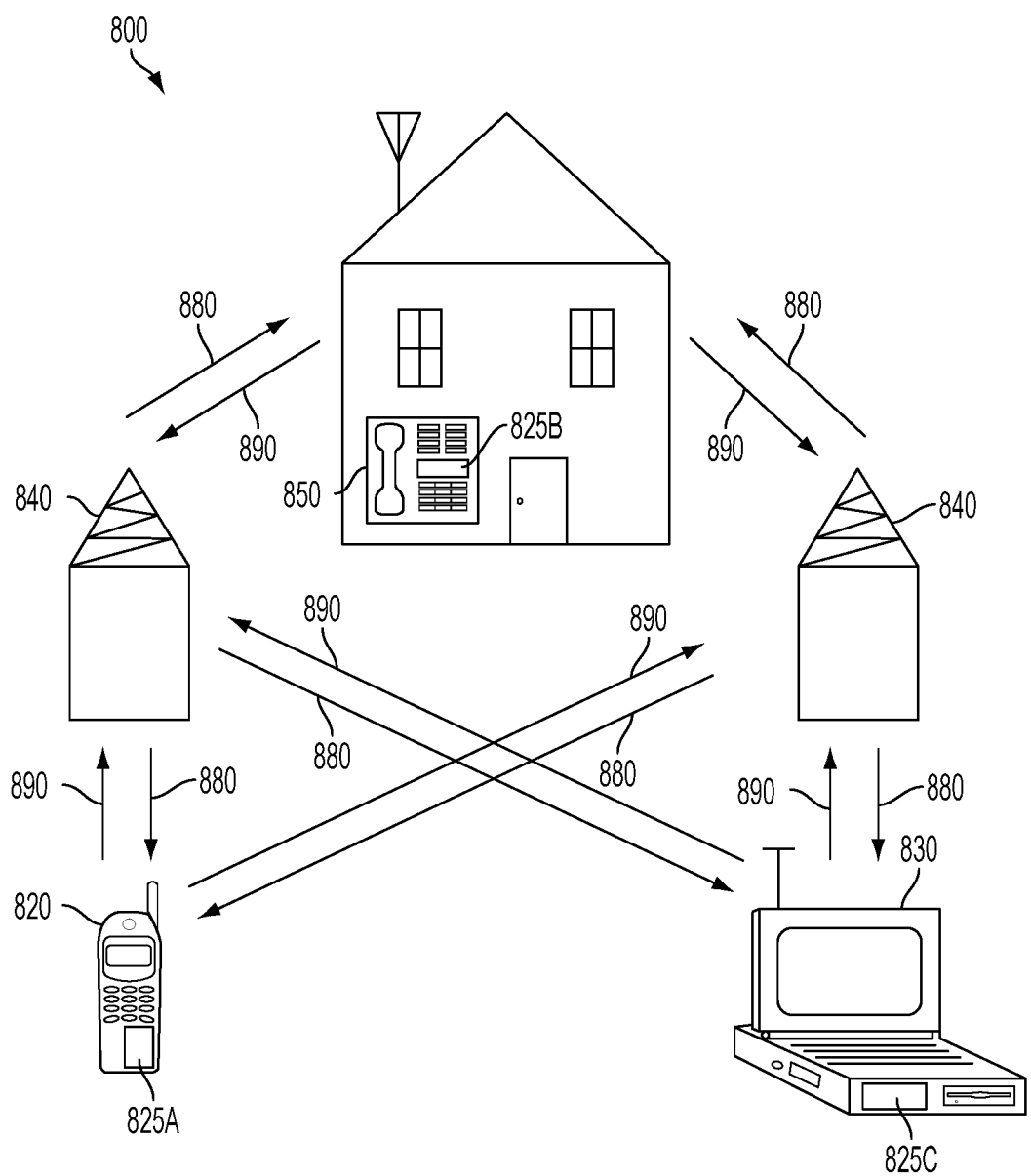
FIG. 8 is a block diagram showing an exemplary wireless communication system in which a tunable capacitor and device structures may be advantageously employed.

FIG. 8 is a block diagram showing an exemplary wireless communication system 8 in which an aspect of the disclosure may be advantageously employed. For purposes of illustration, FIG. 8 shows three of the remote units 820, 830, and 850 and two of the base stations 840. It will be recognized that wireless communication systems may have many more remote units and base stations. Remote units 820, 830, and 850 include IC devices 825A, 825C, and 825B that include the disclosed tunable capacitor and device structures. It will be recognized that other devices may also include the disclosed tunable capacitor and device structures, such as the base stations, switching devices, and network equipment. FIG. 8 shows forward link signals 880 from one of the base stations 840 to the remote units 820, 830, and 850 and reverse link signals 890 from the remote units 820, 830, and 850 to base stations 840.

In FIG. 8, one of the remote units 820 is shown as a mobile telephone, one of the remote units 830 is shown as a portable computer, and remote unit 850 is shown as a fixed location remote unit in a wireless local loop system. For example, the remote units may be a mobile phone, a handheld personal communication systems (PCS) unit, a portable data unit such as a personal digital assistant (PDA), a GPS enabled device, a navigation device, a set top box, a music player, a video player, a communications device, an entertainment unit, a fixed location data unit such as a meter reading equipment, or other devices that store or retrieve data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed tunable capacitor and device structures.

Figure 9:
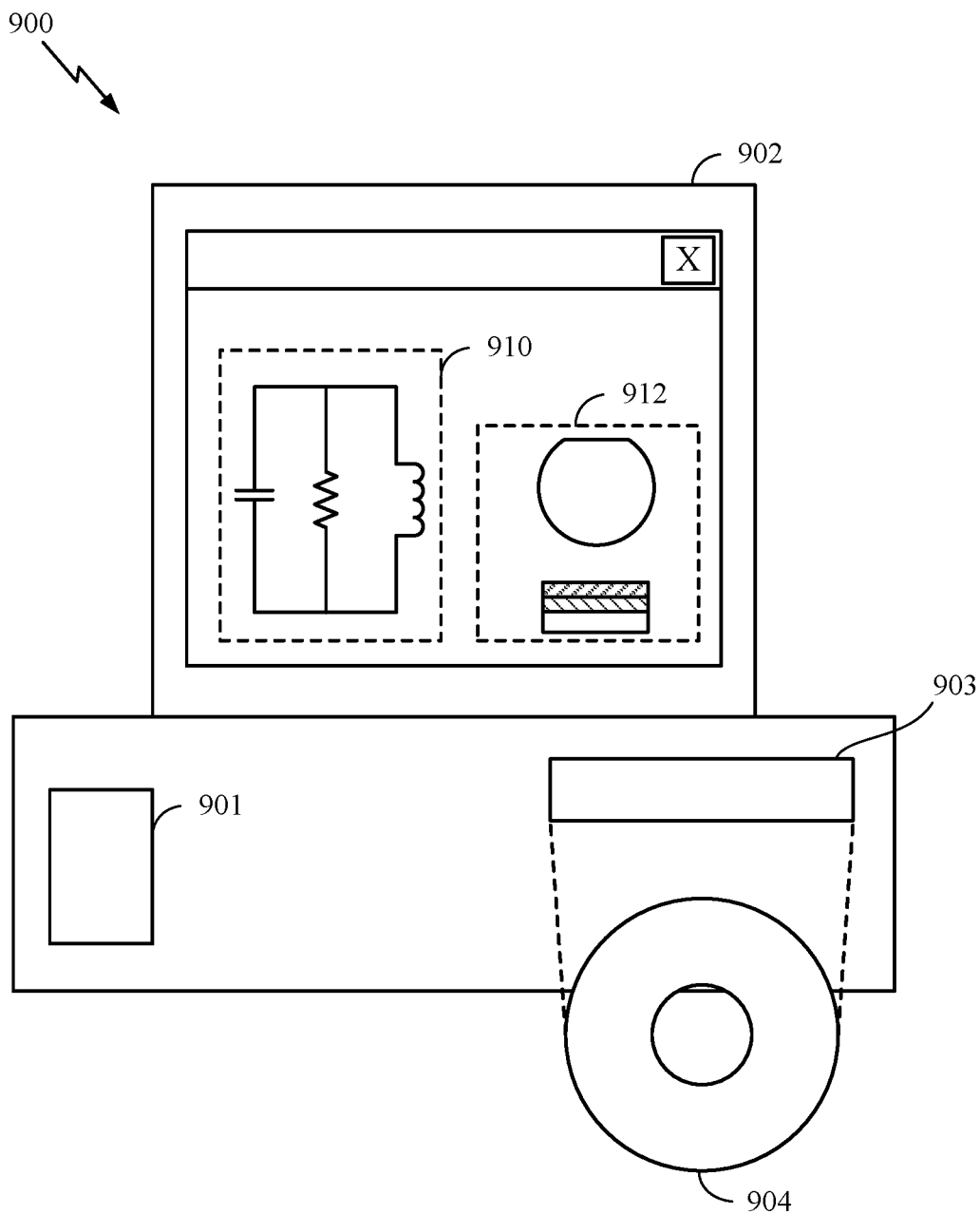
FIG. 9 is a block diagram illustrating a design workstation used for circuit, layout, and logic design of a tunable capacitor and device structures.

FIG. 9 is a block diagram illustrating a design workstation used for circuit, layout, and logic design of the tunable capacitor and device structures disclosed above. A design workstation 900 includes a hard disk 901 containing operating system software, support files, and design software such as Cadence or OrCAD. The design workstation 900 also includes a display 902 to facilitate design of a circuit 910 or a tunable capacitor and device structures 912. A storage medium 904 is provided for tangibly storing the design of the circuit 910 or the tunable capacitor and device structures 912. The design of the circuit 910 or the tunable capacitor and device structures 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the tunable capacitor and device structures 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:
1. A tunable capacitor, comprising:
   a first terminal comprising a first semiconductor component with a first polarity;
   a second terminal comprising a second semiconductor component with a second polarity, adjacent to the first semiconductor component; and a first conductive material electrically coupled to a first depletion region, the first depletion region proximate a first sidewall of the first semiconductor component.

2. The tunable capacitor of claim 1, further comprising a second conductive material electrically coupled to a second depletion region at a second sidewall of the first semiconductor component.

3. The tunable capacitor of claim 2, in which the second depletion region extends onto a surface of the second conductive material that faces the second semiconductor component.

4. The tunable capacitor of claim 1, in which the first semiconductor component comprises a compound semiconductor.

5. The tunable capacitor of claim 4, in which the first semiconductor component comprises a III-V compound semiconductor material or a II-VI compound semiconductor material.

6. The tunable capacitor of claim 1, in which the first conductive material comprises a metal stack.

7. The tunable capacitor of claim 1, in which the first conductive material comprises a Schottky contact.

8. The tunable capacitor of claim 1, in which the first depletion region extends onto a surface of the first conductive material that faces the second semiconductor component.

9. The tunable capacitor of claim 1, in which the first semiconductor component comprises an N-type collector, and the second semiconductor component comprises a P-type doped base.

10. The tunable capacitor of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

11. A method of integrating a semiconductor device with a complementary metal-oxide-semiconductor (CMOS) structure, comprising:
 forming a collector layer, a base layer, and an emitter layer on a semiconductor substrate;
 patterning the emitter layer;
 fabricating metallization to access the emitter layer;
 bonding the CMOS structure to the semiconductor substrate;
 patterning the collector layer and the base layer to form the semiconductor device;
 forming vias to access the CMOS structure; and
 electrically coupling the CMOS structure to the semiconductor device.

12. The method of claim 11, in which the CMOS structure comprises a CMOS capacitor and the semiconductor device comprises a heterojunction bipolar transistor (HBT) and/or a tunable capacitor.

13. The method of claim 11, in which the semiconductor device comprises a III-V compound semiconductor material or a II-VI compound semiconductor material.

14. The method of claim 11, in which the CMOS structure comprises at least one CMOS device.

15. The method of claim 11, further comprising fabricating at least one conductive bump.

16. The method of claim 11, in which the semiconductor substrate comprises silicon, gallium arsenide (GaAs), or indium phosphide.

17. The method of claim 11, further comprising integrating the semiconductor device into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

18. A radio frequency (RF) front end module, comprising:
 a filter, comprising a die, a substrate supporting the die, a molding compound surrounding the die, a tunable capacitor comprising a first terminal comprising a first semiconductor component with a first polarity, a second terminal comprising a second semiconductor component with a second polarity, adjacent to the first semiconductor component, and a first conductive material electrically coupled to a first depletion region at a first sidewall of the first semiconductor component;
 a diplexer coupled to the filter; and
 an antenna coupled to an output of the diplexer.

19. The RF front end module of claim 18, in which the first semiconductor component comprises an N-type collector, and the second semiconductor component comprises a P-type doped base.

20. The RF front end module of claim 18, incorporated into at least one of a music player, a video player, an entertainment unit, a navigation device, a communications device, a personal digital assistant (PDA), a fixed location data unit, a mobile phone, and a portable computer.

* * * * *